(12) United States Patent
Asada

(10) Patent No.: US 12,170,270 B2
(45) Date of Patent: Dec. 17, 2024

(54) ANISOTROPIC CONDUCTIVE FILM AND DISPLAY DEVICE

(71) Applicant: Japan Display Inc., Tokyo (JP)

(72) Inventor: Keisuke Asada, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 521 days.

(21) Appl. No.: 17/549,930

(22) Filed: Dec. 14, 2021

(65) Prior Publication Data

US 2022/0102326 A1 Mar. 31, 2022

Related U.S. Application Data

(63) Continuation of application No. PCT/JP2020/020790, filed on May 26, 2020.

(30) Foreign Application Priority Data

Jun. 26, 2019 (JP) .................................. 2019-118762

(51) Int. Cl.
*H01L 25/075* (2006.01)
*H01L 33/62* (2010.01)

(52) U.S. Cl.
CPC .......... *H01L 25/0753* (2013.01); *H01L 33/62* (2013.01)

(58) Field of Classification Search
CPC ..... H01L 25/0753; H01L 33/62; H01L 24/32; H01L 24/83; H01L 24/29; H01L 25/167; H01L 2223/5442; H01L 2223/54426; H01L 2223/54486; H01L 2224/2929; H01L 2224/32225; H01L 2224/83132; H01L 2224/83192; H01L 2224/83851; H01L 2924/07811; H01L 2924/12041;
(Continued)

(56) References Cited

U.S. PATENT DOCUMENTS 9,345,129 B2 5/2016 Saito
2001/0008169 A1 7/2001 Connell et al.
(Continued)

FOREIGN PATENT DOCUMENTS

CN 107452438 A 12/2017
JP 2002-519473 A 7/2002
(Continued)

OTHER PUBLICATIONS

International Search Report and Written Opinion mailed on Jul. 28, 2020, received for PCT Application PCT/JP2020/020790, Filed on May 26, 2020, 13 pages including English Translation.
(Continued)

*Primary Examiner* — Victor A Mandala
(74) *Attorney, Agent, or Firm* — XSENSUS LLP

(57) ABSTRACT

An anisotropic conductive film in which conductive particles are dispersed in a resin includes a first region having a first pattern in which the conductive particles are discretely arranged, and a second region having a first shape by aggregating the conductive particles. Further, a display device includes a substrate provided with a plurality of electrodes arranged in a first pattern, the anisotropic conductive film, and a plurality of light emitting diodes. The plurality of light emitting diodes is electrically connected to the plurality of electrodes through the conductive particles in the first region.

10 Claims, 12 Drawing Sheets

(58) Field of Classification Search
CPC . H01L 2933/0066; H01L 23/544; G09F 9/30;
G09F 9/33; G09F 13/20; H01R 11/01
See application file for complete search history.

(56) References Cited

U.S. PATENT DOCUMENTS

| | | | |
|---|---|---|---|
| 2005/0104223 A1* | 5/2005 | Huang | H01L 24/83 |
| | | | 257/E23.021 |
| 2005/0104225 A1* | 5/2005 | Huang | H01L 24/83 |
| | | | 257/E23.021 |
| 2009/0015281 A1 | 1/2009 | Yoshioka et al. | |
| 2009/0032979 A1 | 2/2009 | Nishikawa et al. | |
| 2016/0149366 A1* | 5/2016 | Akutsu | C09J 9/02 |
| | | | 428/206 |
| 2016/0240516 A1 | 8/2016 | Chang | |
| 2017/0047306 A1 | 2/2017 | Meitl et al. | |
| 2017/0317047 A1 | 11/2017 | Akutsu | |
| 2017/0323701 A1* | 11/2017 | Ishimatsu | H05K 3/323 |
| 2017/0352967 A1 | 12/2017 | Hayashi et al. | |
| 2018/0017715 A1* | 1/2018 | Matsuda | H01B 5/14 |
| 2018/0145236 A1 | 5/2018 | Huang et al. | |
| 2018/0243824 A1* | 8/2018 | Nakamura | B22F 7/06 |
| 2018/0250738 A1* | 9/2018 | Nakamura | B22F 1/102 |
| 2018/0287273 A1* | 10/2018 | Kubode | C08K 9/02 |
| 2019/0035760 A1 | 1/2019 | Li et al. | |
| 2019/0206831 A1 | 7/2019 | Akutsu | |
| 2019/0348588 A1* | 11/2019 | Hsieh | H01L 33/62 |
| 2020/0239651 A1* | 7/2020 | Paik | C08K 3/08 |
| 2021/0181876 A1* | 6/2021 | Feng | G06F 3/045 |
| 2023/0194942 A1* | 6/2023 | Fujikawa | G02F 1/136259 |
| | | | 257/89 |

FOREIGN PATENT DOCUMENTS

| | | |
|---|---|---|
| JP | 2009-19974 A | 1/2009 |
| JP | 2009-38115 A | 2/2009 |
| JP | 2016-103476 A | 6/2016 |
| JP | 2016-119306 A | 6/2016 |
| JP | 2019-15899 A | 1/2019 |
| TW | 200909814 A | 3/2009 |
| TW | 201138577 A | 11/2011 |
| TW | 201535017 A | 9/2015 |
| TW | 201635648 A | 10/2016 |
| TW | 201919104 A | 5/2019 |

OTHER PUBLICATIONS

Office Action mailed on May 13, 2021, received for Taiwan Application 109120185, 13 pages of English Translation.

English translation of Office Action issued on Mar. 28, 2023, in corresponding Japanese patent Application No. 2019118762, 8 pages.

\* cited by examiner

ANISOTROPIC CONDUCTIVE FILM AND DISPLAY DEVICE

CROSS-REFERENCE TO RELATED APPLICATIONS

This application is based on the PCT Application No. PCT/JP2020/020790, filed on May 26, 2020, and claims the benefit of priority from the prior Japanese Patent Application No. 2019-118762, filed on Jun. 26, 2019, the entire contents of which are incorporated herein by reference.

BACKGROUND OF THE INVENTION

Field

One embodiment of the present invention relates to an anisotropic conductive film. Further, one embodiment of the present invention relates to a display device using an anisotropic conductive film.

Description of the Related Art

In a small or medium-sized display device such as a smart phone, a display using liquid crystals or OLEDs (Organic Light Emitting Diodes) has been commercialized. In particular, an OLED display device using the OLEDs, which are a self-light emitting element, has the advantages of high-contrast and no need for a backlight, as compared with a liquid crystal display device. However, since the OLEDs are composed of organic compounds, it is difficult to secure high reliability of the OLED display device due to deterioration of the organic compounds.

On the other hand, a so-called micro LED display in which minute micro LEDs are placed in pixels arranged in a matrix has been developed as a next-generation display. The micro LEDs are self-emitting elements similar to the OLEDs, but unlike OLEDs, the micro LEDs are composed of inorganic compounds containing gallium (Ga) or indium (In). Therefore, it is easier to ensure a highly reliable micro LED display as compared with the OLED display. In addition, micro LEDs have high light emission efficiency and high brightness. Therefore, the micro LED display is expected to be the next generation display with high reliability, high brightness, and high contrast.

The micro LEDs are formed on a substrate such as sapphire similar to typical LEDs, and are separated into individual micro LEDs by dicing the substrate. In the micro LED display, it is necessary to place the diced micro LEDs in the pixels of a circuit substrate (also referred to as a backplane or a TFT substrate). As one of the methods for placing the micro LEDs on the circuit substrate, a transfer substrate is used to pick up a plurality of micro LEDs from an element substrate, the transfer substrate is attached to the circuit substrate, and the plurality of micro LEDs are transferred to the circuit substrate (See, for example, U.S. Patent Application Publication No. 2016/0240516 or U.S. Patent Application Publication No. 2017/0047306.). On the other hand, a connection method using an anisotropic conductive film (ACF) has been attempted for electrical connections between electrodes provided on the circuit substrate and the micro LEDs (for example, U.S. Patent Application Publication No. 2018/0145236).

SUMMARY OF THE INVENTION

An anisotropic conductive film according to an embodiment of the present invention is an anisotropic conductive film in which conductive particles are dispersed in a resin. The anisotropic conductive film includes a first region having a first pattern in which the conductive particles are discretely arranged, and a second region having a first shape by aggregating the conductive particles.

An anisotropic conductive film according to a display device includes a substrate provided with a plurality of electrodes arranged in a first pattern, an anisotropic conductive film in which conductive particles are dispersed in a resin. and a plurality of light emitting diodes. The anisotropic conductive film includes a first region having the first pattern in which the conductive particles are discretely arranged and a second region having a first shape by aggregating the conductive particles. The plurality of light emitting diodes is electrically connected to the plurality of electrodes through the conductive particles in the first region.

DESCRIPTION OF EMBODIMENTS

When a minute element such as a micro LED is arranged on an electrode of a circuit substrate via an anisotropic conductive film, it is necessary to form a pattern in which the conductive particles included the anisotropic conductive film are dispersed as much as possible to prevent a short circuit between adjacent electrodes. Further, even if the conductive particles can be dispersed so as to correspond to the electrode arrangement pattern of the circuit substrate, alignment between the circuit substrate and the anisotropic conductive film becomes a problem.

In view of the above problems, it is one object of the present invention to provide an anisotropic conductive film that can be aligned with a circuit substrate while suppressing manufacturing costs. Further, it is one object of the present invention to provide a display device using the anisotropic conductive film.

Hereinafter, embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In each embodiment of the present invention, the term "over" or "below" is used for convenience of explanation, but the vertical relationship in the explanation may be reversed. Further, in the following description, for example, the expression "element over a substrate" merely explains the vertical relationship between the substrate and the element, and another member may be placed between the substrate and the element. Furthermore, the term "over" or "below" means the stacking order of a structure in which a plurality of members are stacked, and does not necessarily mean that a plurality of members are overlapped.

In the specification, the expressions "a includes A, B or C", "a includes any of A, B and C", and "a includes one selected from the group consisting of A, B and C" do not exclude the case where a includes a plurality of combinations of A to C unless otherwise specified. Furthermore, these expressions do not exclude the case where a includes other elements.

In the present specification, an element is, for example, a microelectromechanical system (MEMS), a laser diode (LD), a mini LED, a micro LED, or the like, but is not limited thereto.

First Embodiment

An anisotropic conductive film 10A according to an embodiment of the present invention is described with reference to FIG. 1.

Structure

Figure 1:
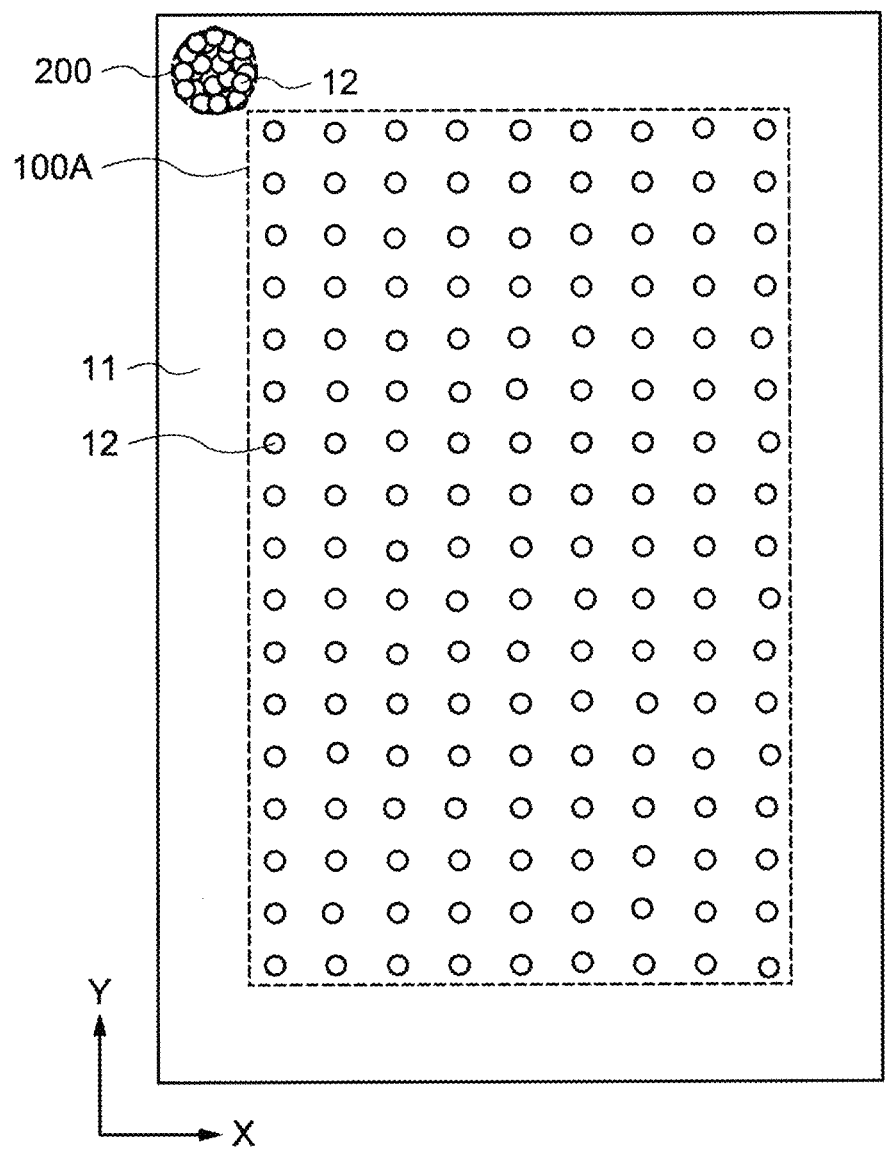
FIG. 1 is a plan view of an anisotropic conductive film according to an embodiment of the present invention.

FIG. 1 is a plan view of the anisotropic conductive film 10A according to the embodiment of the present invention. As shown in FIG. 1, the anisotropic conductive film 10A includes at least a resin 11 and conductive particles 12 dispersed in the resin 11. Further, the anisotropic conductive film 10A includes a first region 100A and a second region 200.

A film thickness of the anisotropic conductive film 10 is greater than or equal to 5 µm and less than or equal to 100 µm, more preferably greater than or equal to 10 µm and less than or equal to 50 µm, and particularly preferably greater than 15 µm and less than or equals to 30 µm.

The first region 100A is a region for electrically connecting to an electrode provided over the circuit substrate. Therefore, the conductive particles 12 included in the first region 100A are dispersed so as to have a pattern corresponding to the electrode pattern of the circuit substrate. For example, as shown in FIG. 1, the conductive particles 12 can be discretely dispersed in a matrix so as to be substantially evenly spaced in an X direction and a Y direction perpendicular to the X direction. The dispersal of the conductive particles 12 is not limited to the case where the conductive particles 12 are separated one by one. The number of the conductive particles 12 arranged at each point of the first region 100A may be one, or two or more. For example, at each point, 1 or more and 10 or less conductive particles 12 may be arranged to form the first region 100A.

The second region 200 is a region for aligning with the circuit substrate. That is, an alignment marker is provided in the second region 200. The second region 200 is located outside the first region 100A. Specifically, the second region 200 is located at one of four corners of the anisotropic conductive film 10A, but is not limited to this. The second region 200 can be provided on an outer peripheral portion of the anisotropic conductive film 10A.

In the second region 200, more conductive particles 12 than each point in the first region 100A are aggregated to form a specific shape. For example, as shown in FIG. 1, the conductive particles 12 can be aggregated to form a circular alignment marker. A size of the second region 200 is greater than or equal to 1 µm and less than or equal to 2000 µm, preferably greater than or equal to 50 µm and less than or equal to 1000 µm, and particularly preferably greater than or equal to 100 µm and less than or equal to 500 µm.

Figure 2A:
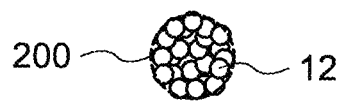
FIG. 2A is an example of a specific shape of a second region of an anisotropic conductive film according to an embodiment of the present invention.
Figure 2B:
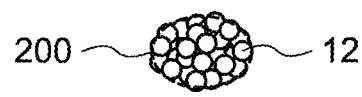
FIG. 2B is an example of a specific shape of a second region of an anisotropic conductive film according to an embodiment of the present invention.
Figure 2C:
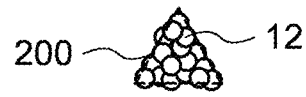
FIG. 2C is an example of a specific shape of a second region of an anisotropic conductive film according to an embodiment of the present invention.
Figure 2D:
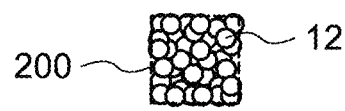
FIG. 2D is an example of a specific shape of a second region of an anisotropic conductive film according to an embodiment of the present invention.
Figure 2E:
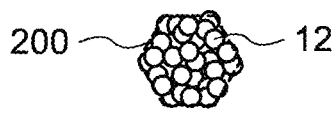
FIG. 2E is an example of a specific shape of a second region of an anisotropic conductive film according to an embodiment of the present invention.
Figure 2F:
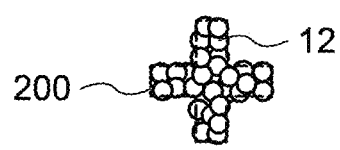
FIG. 2F is an example of a specific shape of a second region of an anisotropic conductive film according to an embodiment of the present invention.
Figure 2G:
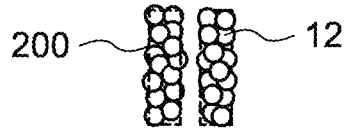
FIG. 2G is an example of a specific shape of a second region of an anisotropic conductive film according to an embodiment of the present invention.

FIGS. 2A to 2G are examples of specific shapes of the second region 200. The specific shape of the second region 200 is not only a circular shape (FIG. 2A) but also an elliptical shape (FIG. 2B) or a polygonal shape such as a triangle shape (FIG. 2C), a quadrangle shape (FIG. 2D) or a hexagon shape (FIG. 2E). Further, the specific shape of the second region 200 may be a cross shape (FIG. 2F). Furthermore, the specific shape of the second region 200 may be a combination of a plurality of shapes, for example, a shape in which two straight lines are combined (FIG. 2G). As described above, the specific shape of the second region 200 has a function as an alignment marker in the alignment between the circuit substrate and the anisotropic conductive film 10A.

Material

The resin 11 can include a thermosetting resin or a photocurable resin. For example, an epoxy resin or an acrylic resin can be used as the thermosetting resin or the photocurable resin.

For example, a bisphenol A type epoxy resin, a bisphenol F type epoxy resin, a novolac type epoxy resin, or a modified epoxy resin thereof can be used as the epoxy resin. Further, these resins may be used alone or in combination of two or more. The content of the epoxy resin in the anisotropic conductive film 10A is not particularly limited, and can be appropriately selected according to the intended purpose.

For example, methyl acrylate, ethyl acrylate, isopropyl acrylate, isobutyl acrylate, phosphate group-containing acrylate, ethylene glycol diacrylate, diethylene glycol diacrylate, trimethylolpropane triacrylate, dimethyloltricyclodecane diacrylate, tetramethylene glycoltetraacrylate, 2-hydroxy-1,3-diacryloxypropane, 2,2-bis[4-(acryloxymethoxy)phenyl] propane, 2,2-bis[4-(acryloxyethoxy)phenyl] propane, dicyclopentenyl acrylate, tricyclodecanyl acrylate, tris(acryloxyethyl) isocyanurate, urethane acrylate, epoxy acrylate, or methacrylates of these acrylates can be used as the acryl resin. These resins may be used alone or two or more may be mixed and used. The content of the epoxy resin in the anisotropic conductive film 10A is not particularly limited, and can be appropriately selected according to the intended purpose.

The resin 11 can also contain a cationic curing agent, a radical curing agent, or a silane coupling agent.

For example, a sulfonium salt or an onium salt can be used as the cationic curing agent, and an aromatic sulfonium salt can be particularly preferably used as the cationic curing agent. Further, the cationic curing agent is preferably used in combination with the above-mentioned epoxy resin. The content of the cationic curing agent in the anisotropic conductive film 10A is not particularly limited, and can be appropriately selected according to the intended purpose.

For example, an epoxy-based silane coupling agent, an acrylic-based silane coupling agent, a thiol-based silane coupling agent, an amine-based silane coupling agent, or the like can be used as the silane coupling agent. The content of the silane coupling agent in the anisotropic conductive film 10A is not particularly limited, and can be appropriately selected according to the intended purpose.

For example, nickel, cobalt, gold, silver, copper, palladium, iron, aluminum, zinc or the like can be used as the conductive particles 12. These conductive particles 12 may be used alone or in combination of two or more. The content of the conductive particles 12 in the anisotropic conductive film 10A is not particularly limited, and can be appropriately selected according to the intended purpose.

Further, metal-coated resin particles can also be used as the conductive particles 12. For example, a styrene-divinylbenzene copolymer, a benzoguanamine resin, a crosslinked polystyrene resin, an acrylic resin, a styrene-silica composite resin, or the like can be used as the resin particles. For example, nickel, cobalt, gold, silver, copper, palladium, iron, aluminum, zinc, or the like can be used as the metal for coating the resin.

An average particle size of the conductive particles 12 is not particularly limited, but is, for example, greater than or equal to 0.1 µm and less than or equal to 50 µm, and more preferably greater than or equal to 1 µm and less than or equal to 30 µm. The average particle size of the conductive particles 12 is obtained by measuring several or several tens of conductive particles 12 with, for example, a particle size distribution meter or a scanning electron microscope (SEM), and averaging the measured values.

In the anisotropic conductive film 10A according to the embodiment of the present invention, the conductive particles 12 are dispersed in the first region 100A so as to correspond to the electrodes of the circuit substrate and are aggregated in the second region 200 to form the alignment marker. Therefore, since the anisotropic conductive film 10A has the alignment marker, the alignment between the anisotropic conductive film 10A and the circuit substrate becomes easy. Further, since the alignment marker of the anisotropic conductive film 10A can be formed only by the step of dispersing the conductive particles 12, a production cost of the anisotropic conductive film 10A can be suppressed.

Modification 1

An anisotropic conductive film 10B, which is a modification of the anisotropic conductive film 10A according to the present embodiment, is described with reference to FIG. 3. In the following explanation, the description of the configuration similar to that of the anisotropic conductive film 10A is omitted, and a configuration different from that of the anisotropic conductive film 10A is mainly described.

Figure 3:
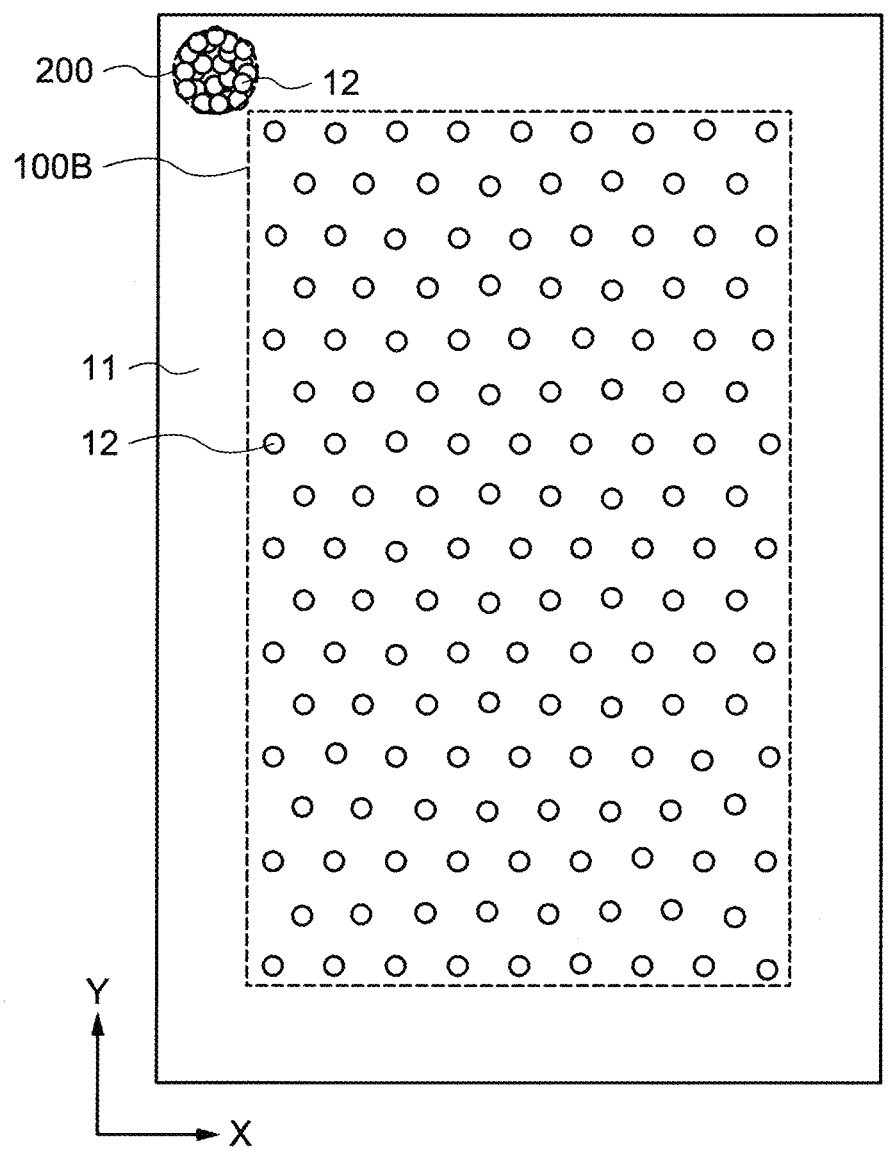
FIG. 3 is a plan view of an anisotropic conductive film according to an embodiment of the present invention.

FIG. 3 is a plan view of the anisotropic conductive film 10B according to the embodiment of the present invention. As shown in FIG. 3, the anisotropic conductive film 10B includes at least the resin 11 and the conductive particles 12 dispersed in the resin 11. Further, the anisotropic conductive film 10B includes a first region 100B and the second region 200.

In the first region 100B, the conductive particles 12 are dispersed in a staggered manner. That is, the conductive particles 12 at each point are arranged so that the angle formed by two adjacent points from a certain point is 60 degrees. The formed angle is not limited to 60 degrees. The formed angle may be 30 degrees or 45 degrees.

Also in the anisotropic conductive film 10B according to the Modification 1 of the present embodiment, the conductive particles 12 are dispersed in the first region 100B so as to correspond to the electrodes of the circuit substrate and are aggregated in the second region 200 to form the alignment marker. Therefore, since the anisotropic conductive film 10B has the alignment marker, the alignment between the anisotropic conductive film 10B and the circuit substrate becomes easy. Further, since the alignment marker of the anisotropic conductive film 10B can be formed only by the step of dispersing the conductive particles 12, a production cost of the anisotropic conductive film 10B can be suppressed.

Modification 2

An anisotropic conductive film 100, which is another modification of the anisotropic conductive film 10A according to the present embodiment, is described with reference to FIG. 4. In the following, the configuration similar to that of the anisotropic conductive film 10A is omitted, and a configuration different from that of the anisotropic conductive film 10A is mainly described.

Figure 4:
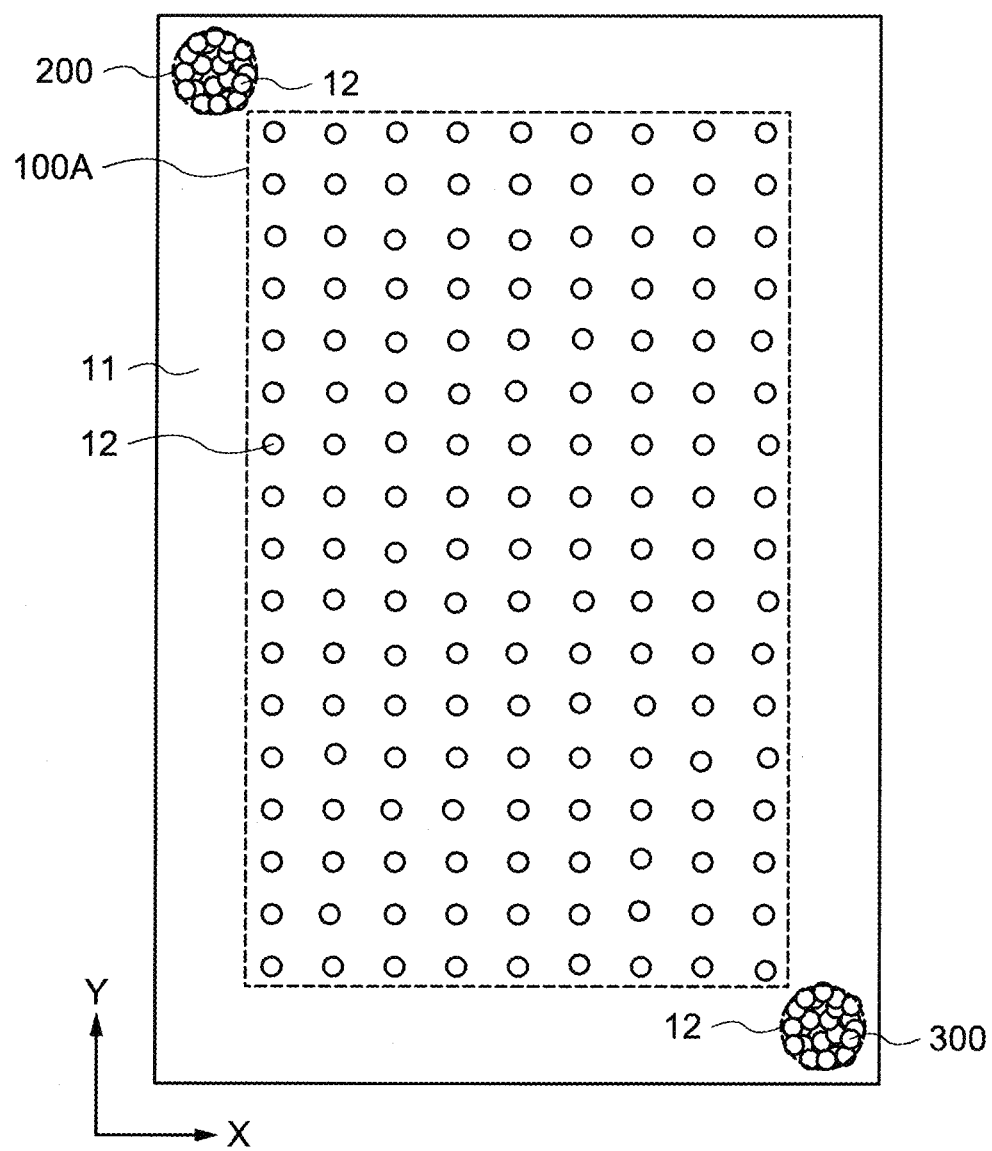
FIG. 4 is a plan view of an anisotropic conductive film according to an embodiment of the present invention.

FIG. 4 is a plan view of the anisotropic conductive film 100 according to the embodiment of the present invention. As shown in FIG. 4, the anisotropic conductive film 100 includes at least the resin 11 and the conductive particles 12 dispersed in the resin 11. Further, the anisotropic conductive film 100 includes the first region 100A, the second region 200, and a third region 300.

The third region 300 is a region for aligning with the circuit substrate, similar to the second region 200. That is, an alignment marker is provided in the third region 300. The third region 300 is located outside the first region 100A. Specifically, the third region 300 is located at one of the four corners of the anisotropic conductive film 100, but is not limited to this. The third region 300 can be provided on an outer peripheral portion of the anisotropic conductive film 100. Further, the second region 200 and the third region 300 can be provided so as to be located on a diagonal line of the anisotropic conductive film 10C, but the present invention is not limited to this. The second region 200 and the third region 300 may be provided so as to be located on a straight line parallel to one side of the anisotropic conductive film 100.

Similar to the second region 200, in the third region 300, more conductive particles 12 than each point in the first region 100A are aggregated to form a specific shape. The specific shape of the third region 300 may be the same as or different from the specific shape of the second region 200.

By providing the third region 300 in addition to the second region 200, not only a position but also an angle can be adjusted in the alignment between the circuit substrate and the anisotropic conductive film 10C.

Further, although not shown in the drawings, a fourth region for aligning with the circuit substrate can be further provided. That is, the number of alignment markers may be three or more.

Also in the anisotropic conductive film 100 according to the Modification 2 of the present embodiment, the conductive particles 12 are dispersed in the first region 100A so as to correspond to the electrodes of the circuit substrate and are aggregated in the second region 200 and the third region 300 to form the alignment markers. Therefore, since the anisotropic conductive film 10C has the alignment markers, the alignment between the anisotropic conductive film 100 and the circuit substrate becomes easy. Further, since the alignment marker of the anisotropic conductive film 100 can be formed only by the step of dispersing the conductive particles 12, a production cost of the anisotropic conductive film 10C can be suppressed. Furthermore, since the second region and the third region including the alignment markers are provided, not only the position but also the angle can be adjusted in the alignment between the anisotropic conductive film 100 and the circuit substrate. Therefore, the anisotropic conductive film 100 and the circuit substrate can be accurately aligned.

Second Embodiment

An anisotropic conductive film 20A according to an embodiment of the present invention is described with reference to FIG. 5.

Figure 5:
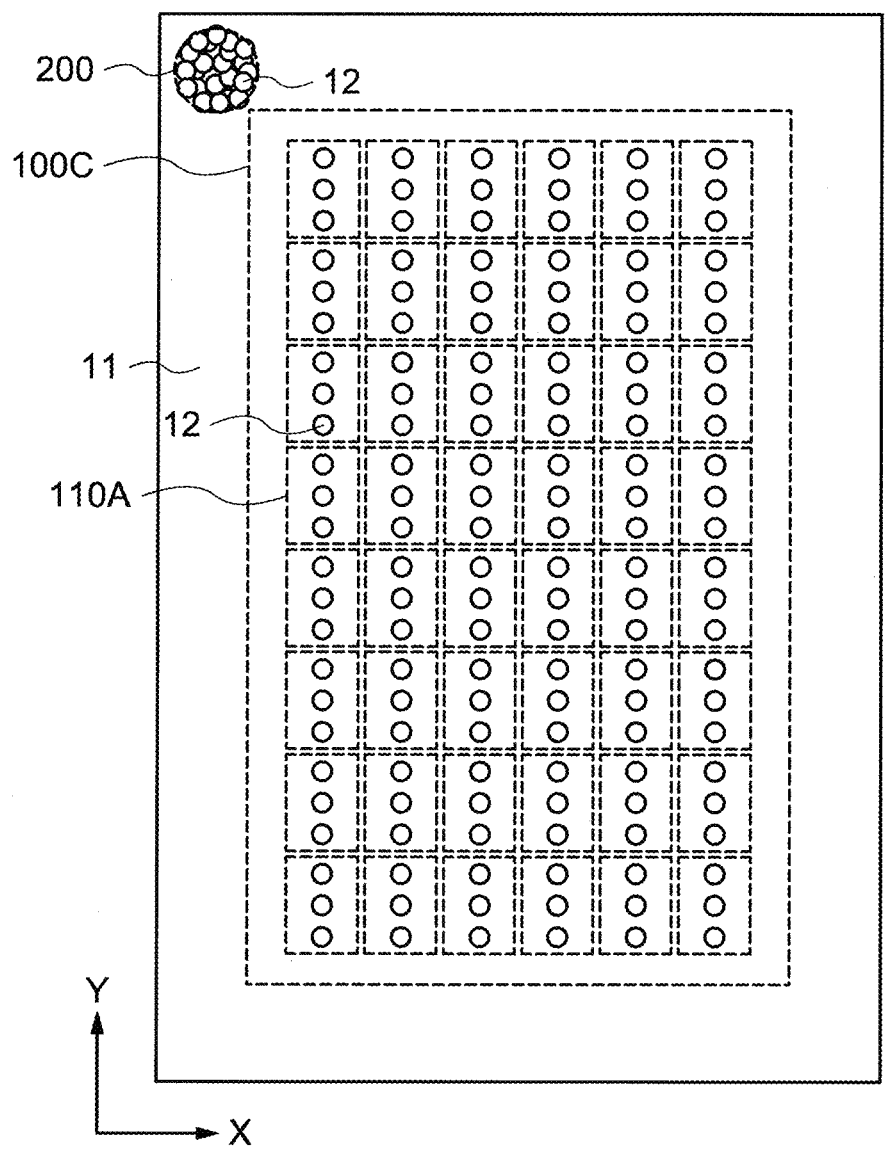
FIG. 5 is a plan view of an anisotropic conductive film according to an embodiment of the present invention.

FIG. 5 is a plan view of the anisotropic conductive film 20A according to the embodiment of the present invention. In the following, the description of the configuration similar to that of the anisotropic conductive film 10A is omitted, and a configuration different from that of the anisotropic conductive film 10A is mainly described.

As shown in FIG. 5, the anisotropic conductive film 20A includes at least the resin 11 and the conductive particles 12 dispersed in the resin 11. Further, the anisotropic conductive film 20A includes a first region 100C and the second region 200.

The first region 100C includes a unit region 110A. That is, a plurality of unit regions 110A are periodically arranged to form the first region 100C. In FIG. 5, the plurality of unit regions 110A are arranged in a matrix to form a first region 100C, but the arrangement of the plurality of unit regions 110A is not limited to this. In the first region 100C, the plurality of unit regions 110A may be periodically arranged.

The unit region 110A has a specific pattern in which the conductive particles 12 are discretely arranged. The arrangement of the conductive particles 12 in the unit region 110A can correspond to the arrangement pattern of the electrodes of the pixels of the circuit substrate to which the anisotropic conductive film 20A is bonded. For example, when the plurality of pixels of the circuit substrate are arranged in a matrix and each pixel includes the plurality of electrodes for electrically connecting to an element, the conductive particles 12 in the unit region 110A are arranged corresponding to the arrangement pattern of the electrodes.

In FIG. 5, in the unit region 110A, the conductive particles 12 are discretely arranged at three points on a diagonal line of the unit region 110A. The number of conductive particles 12 arranged in the unit region 110A is not limited to three. The number of arrangements of the conductive particles 12 may be two or four or more.

The second region 200 functions as the alignment marker in the alignment between the circuit substrate and the anisotropic conductive film 20A.

Modification 1

An anisotropic conductive film 20B, which is a modification of the anisotropic conductive film 20A according to the present embodiment, is described with reference to FIG. 6. In the following explanation, the description of the configuration similar to that of the anisotropic conductive film 20A is omitted, and a configuration different from that of the anisotropic conductive film 20A is mainly described.

Figure 6:
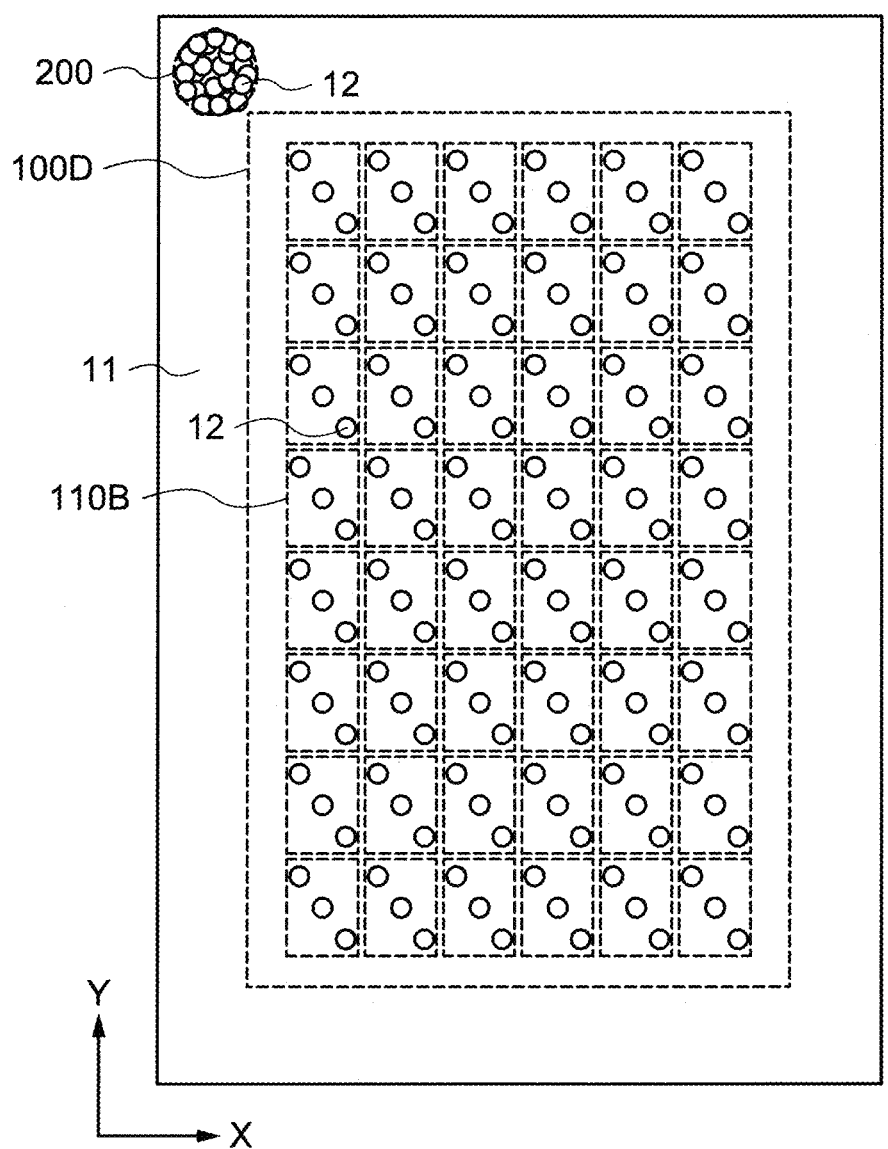
FIG. 6 is a plan view of an anisotropic conductive film according to an embodiment of the present invention.

FIG. 6 is a plan view of the anisotropic conductive film 20B according to the embodiment of the present invention. The anisotropic conductive film 20B includes at least the resin 11 and the conductive particles 12 dispersed in the resin 11. Further, the anisotropic conductive film 20B includes a first region 100D and the second region 200.

The first region 100D includes the plurality of unit regions 110B arranged in a matrix. In the unit region 110B, the conductive particles 12 are discretely arranged at three points on a diagonal line of the unit region 110B. That is, the conductive particles 12 in the unit region 110B are arranged in a straight line.

Modification 2

An anisotropic conductive film 20C, which is a modification of the anisotropic conductive film 20A according to the present embodiment, is described with reference to FIG. 7. In the following explanation, the description of the configuration similar to that of the anisotropic conductive film 20A is omitted, and a configuration different from that of the anisotropic conductive film 20A is mainly described.

Figure 7:
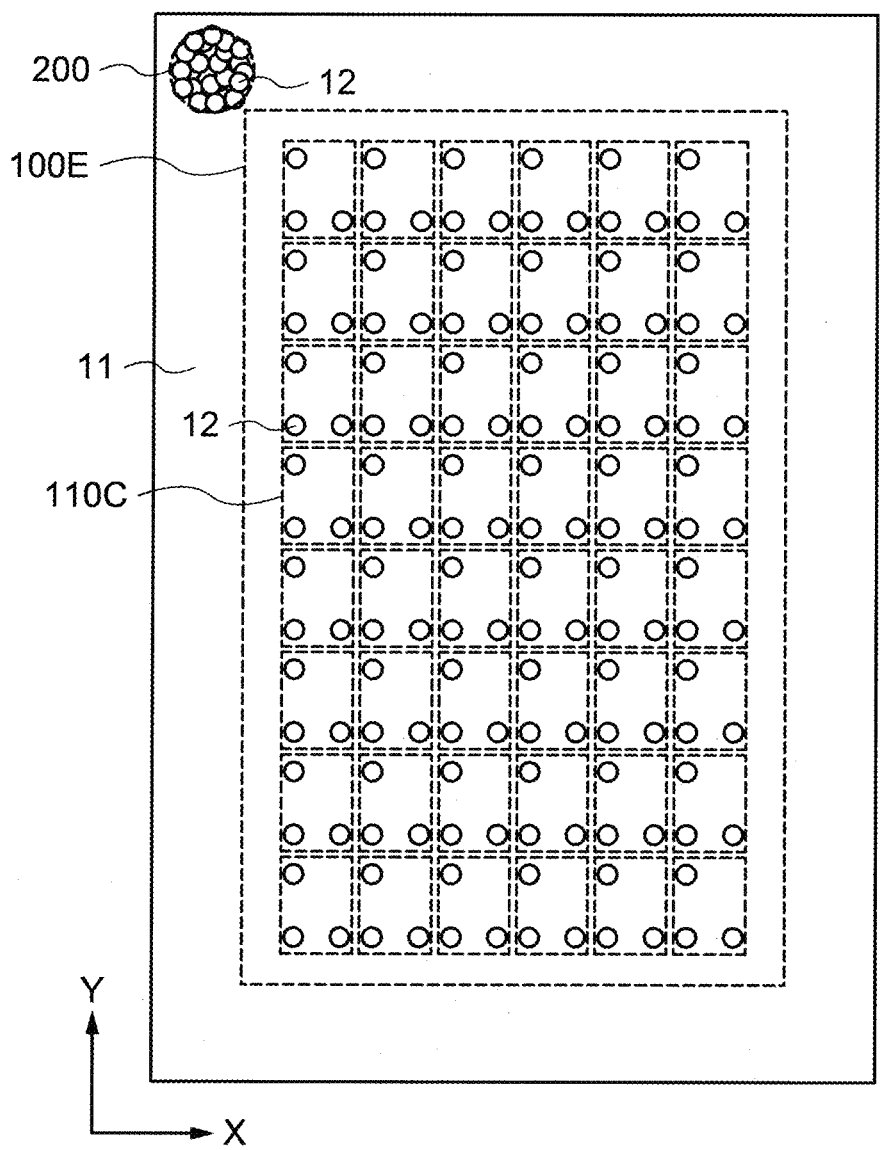
FIG. 7 is a plan view of an anisotropic conductive film according to an embodiment of the present invention.

FIG. 7 is a plan view of the anisotropic conductive film 20C according to the embodiment of the present invention. The anisotropic conductive film 20C includes at least the resin 11 and the conductive particles 12 dispersed in the resin 11. Further, the anisotropic conductive film 20C includes a first region 100E and the second region 200.

The first region 100E includes the plurality of unit regions 110C arranged in a matrix. In the unit region 110, the conductive particles 12 are discretely arranged at three of the four corners of the unit region 110C. That is, the conductive particles 12 in the unit region 110C are arranged so as to form a right triangle. In other words, the conductive particles 12 in the unit region 1106 can be arranged at the vertices of the polygon.

Modification 3

An anisotropic conductive film 20D, which is a modification of the anisotropic conductive film 20A according to the present embodiment, is described with reference to FIG. 8. In the following explanation, the description of the configuration similar to that of the anisotropic conductive film 20A is omitted, and a configuration different from that of the anisotropic conductive film 20A is mainly described.

Figure 8:
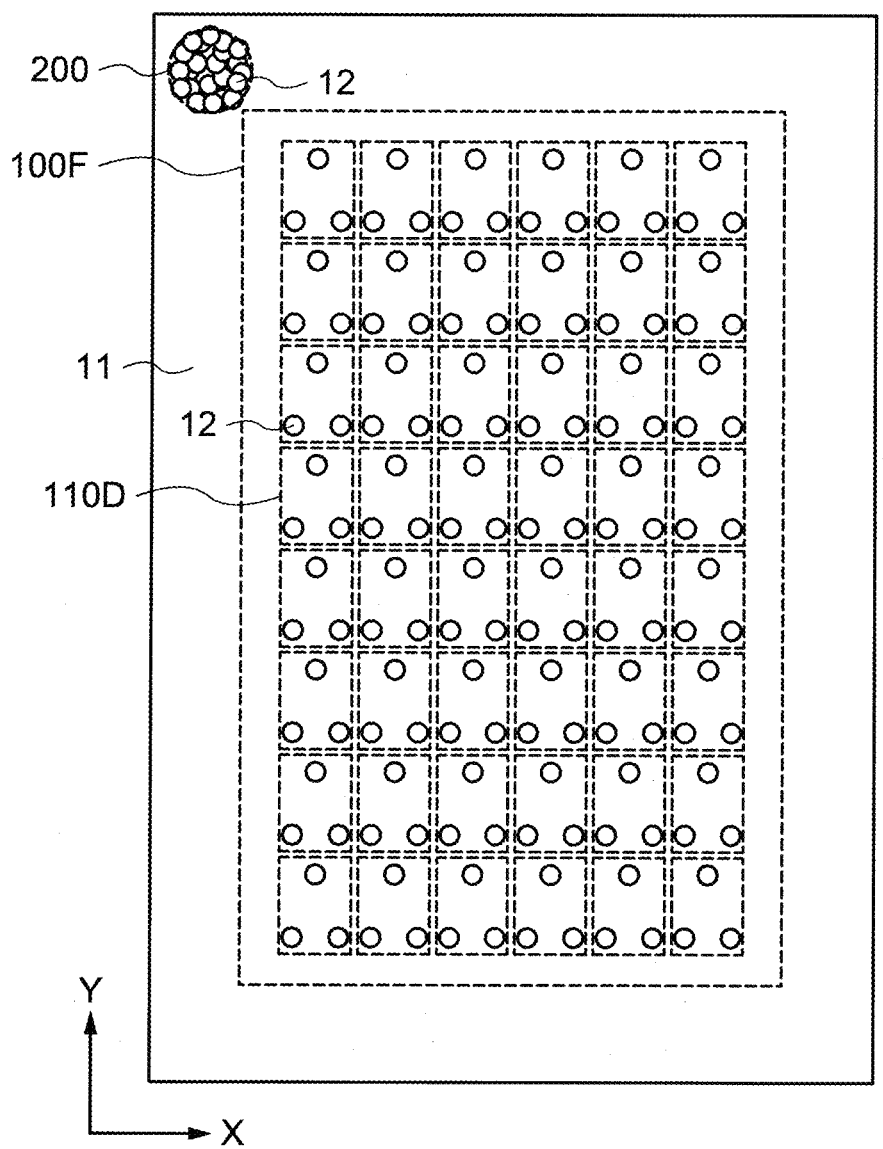
FIG. 8 is a plan view of an anisotropic conductive film according to an embodiment of the present invention.

FIG. 8 is a plan view of the anisotropic conductive film 20D according to the embodiment of the present invention. The anisotropic conductive film 20D includes at least the resin 11 and the conductive particles 12 dispersed in the resin 11. Further, the anisotropic conductive film 20D includes a first region 100F and a second region 200.

The first region 100F includes a plurality of unit regions 110D arranged in a matrix. In the unit region 110D, the conductive particles 12 are discretely arranged at two of the four corners of the unit region 110D and at one section of one side facing the two corners. That is, the conductive particles 12 in the unit region 110D are arranged so as to form an isosceles triangle.

According to the anisotropic conductive films 20A to 20D according to the present embodiment including the Modifications 1 to 3, the first regions 100C to 100F arranged in a matrix as the first pattern and the second region 200 having the circular shape as the first shape are included. In the first regions 100C to 100F, the conductive particles 12 are discretely arranged to form a second pattern. For example, the second pattern can correspond to the electrode pattern in the pixel of the circuit substrate. Further, in the second region 200, the conductive particles 12 are aggregated to form the alignment marker having the first shape. Therefore, since the anisotropic conductive films 20A to 20D each have the alignment marker, the alignment between the anisotropic conductive films 20A to 20D and the circuit substrate becomes easy. Further, since the alignment marker of each of the anisotropic conductive films 20A to 20D can be formed only by the dispersion step of the conductive particles 12, a production cost of the anisotropic conductive films 20A to 20D can be suppressed.

Third Embodiment

A display device according to an embodiment of the present invention is described with reference to FIGS. 9 to 12.

1. Circuit Substrate

Figure 9:
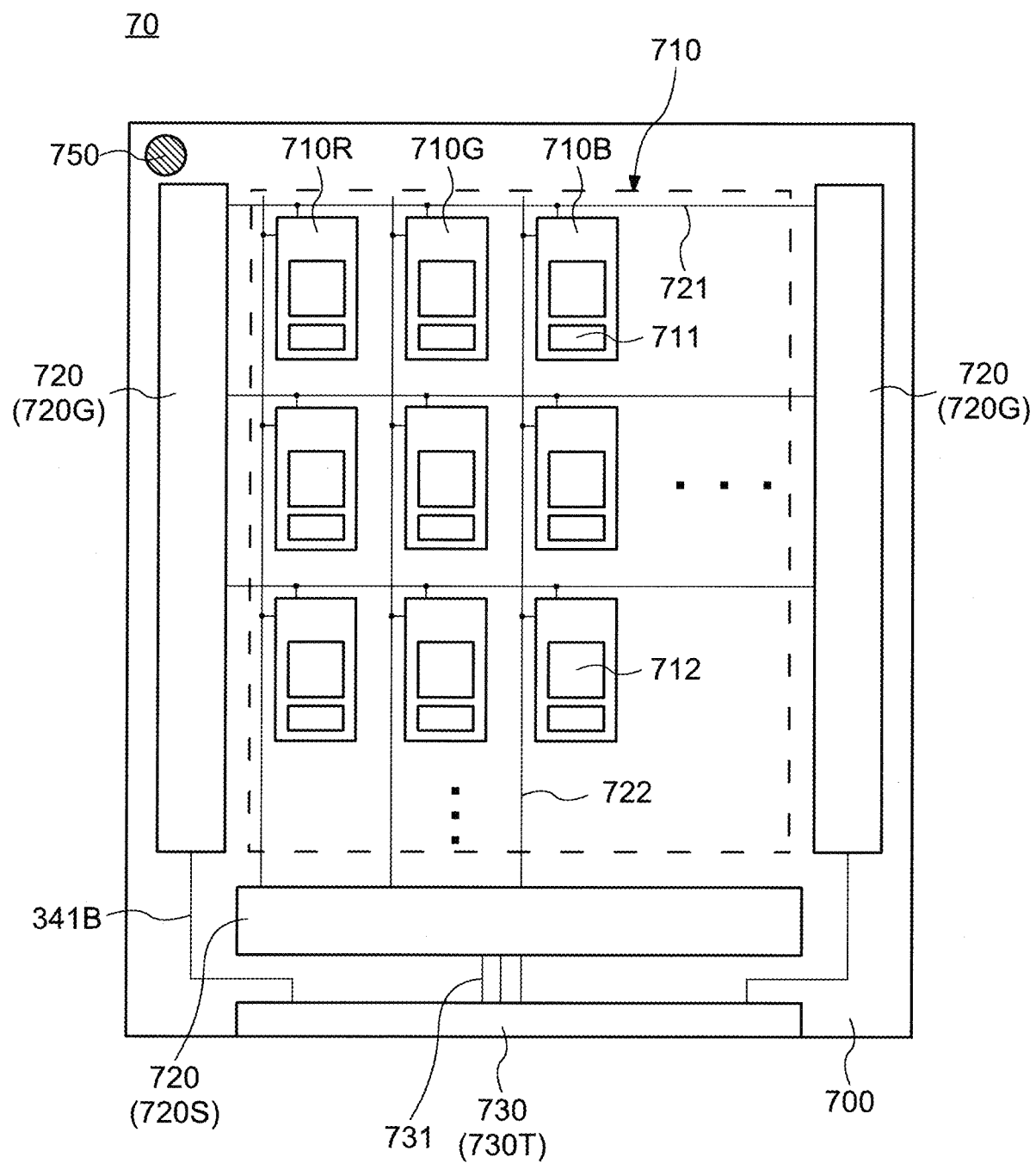
FIG. 9 is a block diagram showing a layout configuration of a circuit substrate of a display device according to an embodiment of the present invention.

FIG. 9 is a block diagram showing a layout configuration of a circuit substrate 70 used in the display device according to the embodiment of the present invention.

As shown in FIG. 9, the circuit substrate 70 is provided with a pixel region 710, a driver circuit region 720, a terminal region 730, and an alignment marker 750 on the substrate 700. The driver circuit region 720 and the terminal region 730 are provided on the outside of the pixel region 710, that is, on a peripheral portion of the substrate 700.

A translucent substrate such as a glass substrate, a quartz substrate, a sapphire substrate, a polyimide substrate, an acrylic substrate, a siloxane substrate, or a fluororesin substrate can be used as the substrate 700. Further, when translucency is not required, a semiconductor substrate such as a silicon substrate, a silicon carbide substrate, or a compound semiconductor substrate, or a conductive substrate such as a stainless steel substrate can be used as the substrate 700.

The pixel region 710 includes a plurality of red light emitting pixels 710R, green light emitting pixels 710G, and blue light emitting pixels 710B. In the pixel region 710, the red light emitting pixel 710R, the green light emitting pixel 710G, and the blue light emitting pixel 710B are arranged in a matrix. Further, each of the red light emitting pixel 710R, the green light emitting pixel 710G, and the blue light emitting pixel 710B is provided with an electrode 712 that is electrically connected to a light emitting element 50. Further, each of the red light emitting pixel 710R, the green light emitting pixel 710G, and the blue light emitting pixel 710B is provided with a pixel circuit 711 for driving the light emitting element 50.

The driver circuit region 720 includes a gate driver circuit 720G and a source driver circuit 720S. The pixel circuit 711 and the gate driver circuit 720G are connected through a gate wiring 721. Further, the pixel circuit 711 and the source driver circuit 720S are connected through a source wiring 722. The red light emitting pixel 710R, the green light emitting pixel 710G, and the blue light emitting pixel 710B are provided at positions where the gate wiring 721 and the source wiring 722 intersect.

The terminal region 730 includes a terminal portion 730T for connecting to an external device. The terminal portion 730T and the gate driver circuit 720G are connected through a connection wiring 731. Further, the terminal portion 730T and the source driver circuit 720S are connected through a connection wiring 732. By connecting a flexible printed circuit substrate (FPC) or the like which is connected to the external device, to the terminal portion 730T, the external device and the circuit substrate 70 are connected. Each pixel circuit 711 provided on the circuit substrate can be driven by a signal from the external device.

The alignment marker 750 is provided on the circuit substrate 70 for alignment with the second region 200 which is the alignment marker of the anisotropic conductive film 10A. The alignment marker 750 of the circuit substrate 70 may be formed of various semiconductor layers or metal layers such as the semiconductor layer 840, the gate electrode layer 820, or the source electrode layer 850S, which is described later. FIG. 9 discloses an example where the alignment marker 750 surrounds the second region 200 shown in FIG. 2A and the second region 200 is inside the alignment marker 750. However, it is not limited to this shape as long as it is possible to align the anisotropic conductive film 10A with the circuit substrate 70.

Next, a thin film transistor (TFT) included in the pixel circuit 711, the gate driver circuit 720G, and the source driver circuit 720S is described with reference to FIG. 10.

Figure 10:
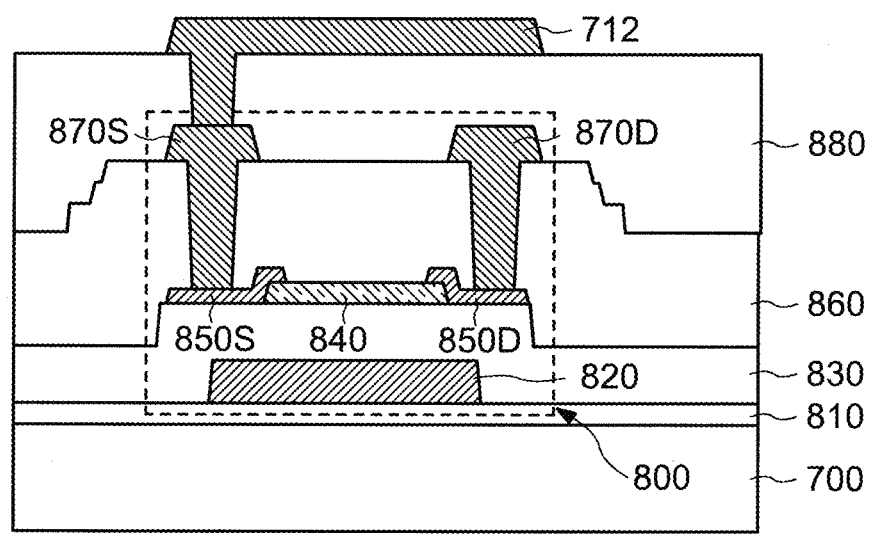
FIG. 10 is a schematic cross-sectional view of a transistor provided in a circuit substrate of a display device according to an embodiment of the present invention.

FIG. 10 is a schematic cross-sectional view of a TFT 800 provided in the circuit substrate 70 of the display device according to the embodiment of the present invention.

As shown in FIG. 10, the TFT 800 includes a base layer 810, a gate electrode layer 820, a gate insulating layer 830, a semiconductor layer 840, a source electrode layer 850S, a drain electrode layer 850D, a protective layer 860, a source wiring layer 870S, a drain wiring layer 870D, a flattening layer 880, and an electrode 712 over the substrate 700.

The gate electrode layer 820, the gate insulating layer 830, and the semiconductor layer 840 are provided in this order over the base layer 810. The source electrode layer 850S is provided at one end of the semiconductor layer 840, and the drain electrode layer 850D is provided at the other end. The source electrode layer 850S and the drain electrode layer 850D are electrically connected to the semiconductor layer 840 on an upper surface and a side surface of the semiconductor layer 840. The protective layer 860, the source wiring layer 870S, and the drain wiring layer 870D are provided over the semiconductor layer 840, the source electrode layer 850S, and the drain electrode layer 850D. The source wiring layer 870S and the drain wiring layer 870D are connected to the source electrode layer 850S and the drain electrode layer 850D, respectively, through openings provided in the protective layer 860. The functions of the source electrode layer 850S and the drain electrode layer 850D may be interchanged. Similarly, the functions of the source wiring layer 870S and the drain wiring layer 870D may be interchanged.

The flattening layer 880 is provided over the source wiring layer 870S and the drain wiring layer 870D. Further, the electrode 712 for electrically connecting to the element is provided over the flattening layer 880. The electrode 712 is electrically connected to the source wiring layer 870S through an opening provided in the flattening layer 880.

For example, silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), or aluminum nitride ($AlN_x$) can be used as the base layer 810, the gate insulating layer 830, and the protective layer 860. Here, $SiO_xN_y$ and $AlO_xN_y$ are respectively a silicon compound and an aluminum compound containing nitrogen (N) in an amount smaller than that of oxygen (O). Further, $SiN_xO_y$ and $AlN_xO_y$ are respectively a silicon compound and an aluminum compound which contain a smaller amount of oxygen than nitrogen.

For example, copper (Cu), aluminum (Al), titanium (Ti), chromium (Cr), and the like. Cobalt (Co), nickel (Ni), molybdenum (Mo), hafnium (Hf), tantalum (Ta), tungsten (W), bismuth (Bi), and alloys or compounds thereof can be used for the gate electrode layer 820, source electrode layer 850S, drain electrode layer 850D, source wiring layer 870S, and drain wiring layer 870D.

For example, a silicon semiconductor such as an amorphous silicon or a polysilicon, or an oxide semiconductor such as a ZnO or an IGZO can be used for the semiconductor layer 840.

For example, an organic insulating material such as an acrylic resin or a polyimide resin can be used for the flattening layer 880.

2. Display Device

Figure 11:
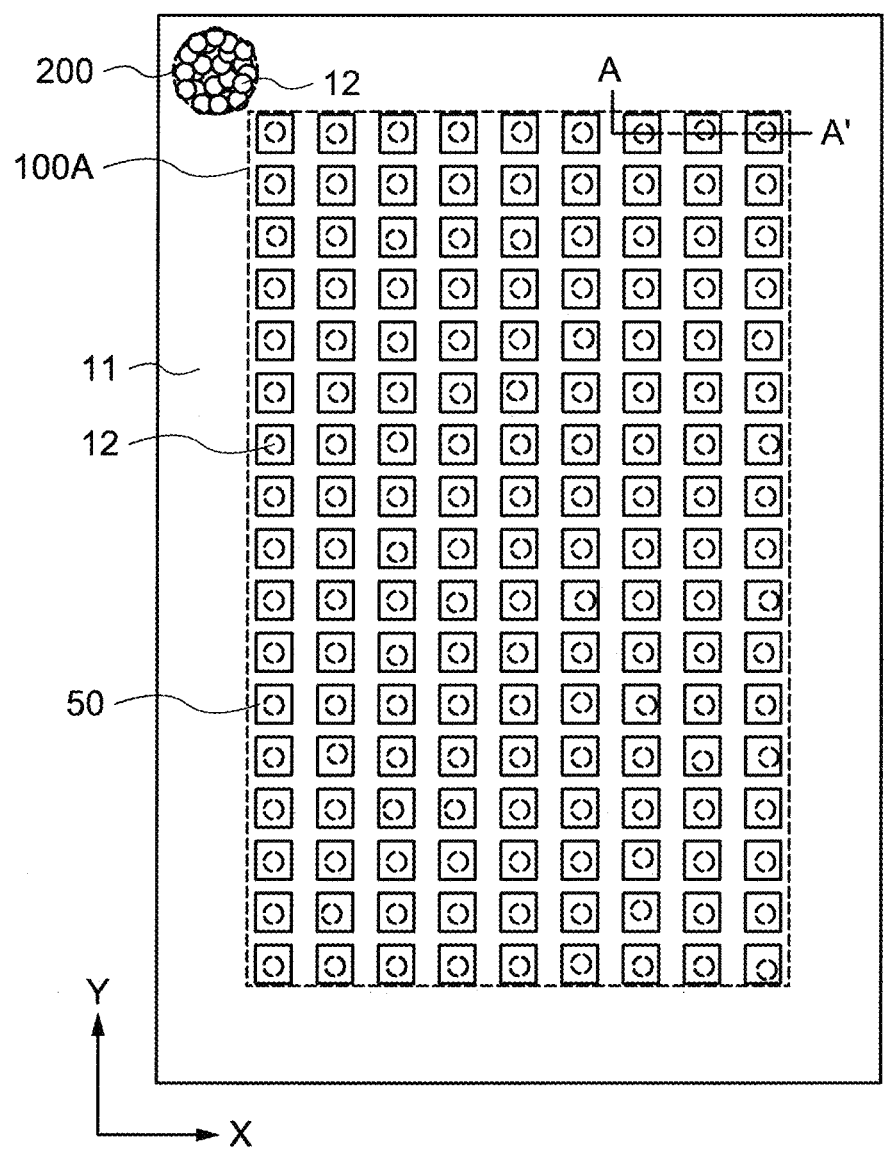
FIG. 11 is a plan view of a display device according to an embodiment of the present invention.
Figure 12:
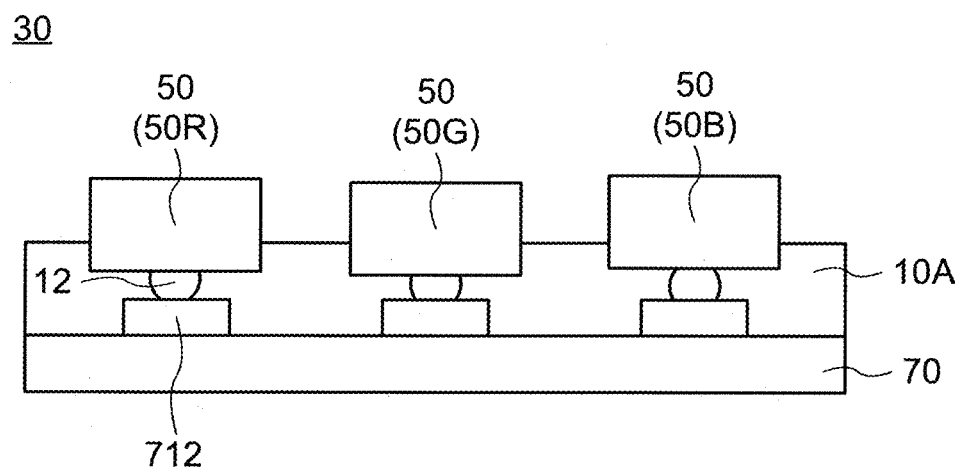
FIG. 12 is a schematic cross-sectional view of a pixel portion of a display device according to an embodiment of the present invention.

FIG. 11 is a schematic plan view of a display device 30 according to the embodiment of the present invention. Further, FIG. 12 is a schematic cross-sectional view of the display device 30 according to the embodiment of the present invention. Specifically, FIG. 12 is a schematic cross-sectional view cut along the line A-A' of FIG. 11, showing a part of the pixel region 710 of the circuit substrate 70.

As shown in FIGS. 11 and 12, the display device 30 includes the circuit substrate 70, the anisotropic conductive film 10A, and the light emitting element 50. The circuit substrate 70 and the anisotropic conductive film 10A are aligned using the second region 200 of the anisotropic conductive film 10A and the alignment marker 750 of the circuit substrate 70, and are bonded so that the pixel region 710 of the substrate 70 and the first region 100A of the anisotropic conductive film 10A overlap each other. Since the circuit substrate 70 and the anisotropic conductive film 10A are aligned with each other, the conductive particles 12 in the first region 100A of the anisotropic conductive film 10A are located on the electrodes 712 of the pixel region 710 of the circuit substrate 70. That is, the conductive particles 12 in the first region 100A of the anisotropic conductive film 10A are provided so as to match the arrangement pattern of the electrodes 712 in the pixel region 710 of the circuit substrate 70.

The light emitting element 50 is provided over the anisotropic conductive film 10A. Further, the light emitting element 50 is electrically connected to the electrode 712 of the circuit substrate 70 through the conductive particles 12.

The light emitting element 50 may be provided with a red light emitting element 50R, a green light emitting element 50G, and a blue light emitting element 50B for each pixel, or a white light emitting element may be provided in common to all the pixels. When the white light emitting element is provided, full color can be displayed by providing red, green, and blue color filters corresponding to each pixel on a side where light is emitted from the white light emitting element. Further, an ultraviolet light emitting element may be provided instead of the white light emitting element. In this case, full color can be displayed by providing red, green, and blue phosphors corresponding to each pixel on a side where light is emitted from the ultraviolet light emitting element.

According to the display device 30 according to the present embodiment, the anisotropic conductive film 10A includes the first region 100A in which the conductive particles 12 are arranged so as to correspond to the electrode pattern of the circuit substrate 70. Further, since the anisotropic conductive film 10A is provided with the second region 200, the shape of the second region 200 can be used as the alignment marker to easily align the circuit substrate 70 with the anisotropic conductive film 10A. Further, since the conductive particles 12 in the first region 100A are arranged discretely while having an electrode pattern, it is possible to prevent a short circuit between the light emitting elements. Furthermore, since the conductive particles 12 are not located at the locations corresponding to the electrode patterns of the circuit substrate 70, when the display device 30 is used as a transparent display, the transparency can be greatly improved as compared to the case where the conductive particles 12 are also located at the locations corresponding to the electrode patterns.

Each of the embodiments described above as an embodiment of the present invention can be appropriately combined and implemented as long as they do not contradict each other. Additions, deletion, or design changes of constituent elements, or additions, omissions, or changes to conditions of steps as appropriate based on a display device of the respective embodiments are also included within the scope of the present invention as long as the gist of the present invention is provided.

Other effects of the action which differ from those brought about by each of the above described embodiments, but which are apparent from the description herein or which can be readily predicted by those skilled in the art, are naturally understood to be brought about by the present invention.

What is claimed is:
1. A display device comprising:
  a substrate provided with a plurality of electrodes arranged in a first pattern;
  an anisotropic conductive film in which conductive particles are dispersed in a resin; and
  a plurality of light emitting diodes,
  wherein the anisotropic conductive film comprises:
    a first region having the first pattern in which the conductive particles are discretely arranged; and
    a second region having a first shape by aggregating the conductive particles, and
  wherein the plurality of light emitting diodes is electrically connected to the plurality of electrodes through the conductive particles in the first region.

2. The display device according to claim 1,
wherein the first pattern is in a matrix, and
the conductive particles in the first region are not arranged in a region that does not overlap the plurality of electrodes.

3. The display device according to claim 1, wherein the first pattern is formed by repeating a second pattern.

4. The display device according to claim 3, wherein the second pattern is a pattern in which the conductive particles are linearly arranged.

5. The display device according to claim 3, wherein the second pattern is a pattern in which the conductive particles are arranged at vertices of a polygon.

6. The display device according to claim 1, wherein the second region is located outside the first region.

7. The display device according to claim 1, wherein the second region is an alignment marker.

8. The display device according to claim 1, wherein the anisotropic conductive film further comprises a third region having a second shape by aggregating the conductive particles.

9. The display device according to claim 8, wherein the second shape is different from the first shape.

10. The display device according to claim 8, wherein the first region is between the second region and the third region.

* * * * *